(12) United States Patent
Bean, Jr. et al.

(10) Patent No.: US 9,274,019 B2
(45) Date of Patent: *Mar. 1, 2016

(54) SYSTEM AND METHOD FOR AIR CONTAINMENT ZONE AIR LEAKAGE DETECTION

(71) Applicant: SCHNEIDER ELECTRIC IT CORPORATION, West Kingston, RI (US)

(72) Inventors: John H. Bean, Jr., Wentzville, MO (US); Zhihai Gordon Dong, Olivette, MO (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 279 days.

This patent is subject to a terminal disclaimer.

(21) Appl. No.: 14/019,834

(22) Filed: Sep. 6, 2013

(65) Prior Publication Data

US 2014/0013827 A1  Jan. 16, 2014

Related U.S. Application Data

(63) Continuation of application No. 12/982,277, filed on Dec. 30, 2010, now Pat. No. 8,534,119.

(51) Int. Cl.
*G01M 3/26* (2006.01)
*G01M 3/04* (2006.01)
*H05K 7/20* (2006.01)

(52) U.S. Cl.
CPC ............. *G01M 3/04* (2013.01); *H05K 7/20745* (2013.01)

(58) Field of Classification Search
CPC ............ F24F 2011/0038; F24F 11/025; F24F 2221/40; G01F 1/46; G01F 1/36; G01F 1/363; G01F 1/42; H05K 7/20745; H05K 7/20836; H05K 7/1488; H05K 7/20; H05K 7/20145
See application file for complete search history.

(56) References Cited

U.S. PATENT DOCUMENTS 1,630,317 A   5/1927   Skonier
3,162,847 A   12/1964  Huffman
(Continued)

FOREIGN PATENT DOCUMENTS

AU   2009338700 A1   8/2011
DE      1943021 A1   3/1970
(Continued)

OTHER PUBLICATIONS

Niemann, John, "Hot Aisle vs. Cold Aisle Containment," White Paper #135, APC by Schneider Electric, 2008 American Power Conversion, WP135Rev 0, pp. 1-13.
(Continued)

*Primary Examiner* — David A Rogers
(74) *Attorney, Agent, or Firm* — Lando & Anastasi, LLP

(57) ABSTRACT

A system for measuring hot or cold aisle containment air leakage in a data center includes a plurality of equipment enclosures arranged in a first row and a second row, a plurality of panels cooperatively arranged with the plurality of equipment enclosures to form an air containment region, and a conduit mounted within the air containment region and sealed at each end, the conduit having an orifice and a plurality of openings distributed at substantially uniform intervals along a length of the conduit.

12 Claims, 7 Drawing Sheets

(56) References Cited

U.S. PATENT DOCUMENTS

| | | | |
|---|---|---|---|
| 3,685,355 A * | 8/1972 | DeBaun | 73/861.66 |
| 3,791,089 A | 2/1974 | Alderman | |
| 4,056,001 A | 11/1977 | Arakelian | |
| 4,083,245 A * | 4/1978 | Osborn | 73/861.53 |
| 4,317,374 A | 3/1982 | Casey | |
| 4,375,224 A | 3/1983 | Noll | |
| 4,561,309 A | 12/1985 | Rosner | |
| 4,696,194 A * | 9/1987 | Taylor | 73/861.66 |
| 5,306,207 A | 4/1994 | Courts | |
| 5,663,508 A | 9/1997 | Sparks | |
| 5,753,825 A | 5/1998 | Brandt, Jr. | |
| 6,109,116 A | 8/2000 | Pelczynski | |
| 6,199,337 B1 | 3/2001 | Colson et al. | |
| 6,450,875 B1 | 9/2002 | Haugen | |
| 6,487,918 B1 | 12/2002 | DeAngelis | |
| 6,668,565 B1 * | 12/2003 | Johnson et al. | 62/89 |
| 6,859,366 B2 | 2/2005 | Fink | |
| 6,880,349 B2 | 4/2005 | Johnson et al. | |
| 6,928,884 B1 * | 8/2005 | Pearson | 73/861.42 |
| 6,967,283 B2 | 11/2005 | Rasmussen et al. | |
| 6,980,433 B2 | 12/2005 | Fink | |
| 7,046,514 B2 * | 5/2006 | Fink et al. | 361/695 |
| 7,096,147 B1 | 8/2006 | Low | |
| 7,140,193 B2 | 11/2006 | Johnson et al. | |
| 7,145,772 B2 | 12/2006 | Fink | |
| 7,165,412 B1 | 1/2007 | Bean, Jr. | |
| 7,173,820 B2 | 2/2007 | Fink et al. | |
| 7,259,963 B2 | 8/2007 | Germagian et al. | |
| 7,293,666 B2 | 11/2007 | Mattlin et al. | |
| 7,325,410 B1 | 2/2008 | Bean, Jr. et al. | |
| 7,430,118 B1 * | 9/2008 | Noteboom et al. | 361/695 |
| 7,520,181 B2 | 4/2009 | Ye et al. | |
| 7,861,596 B2 | 1/2011 | Bean, Jr. | |
| 8,104,707 B1 | 1/2012 | Ohanian, Iii | |
| 8,407,004 B2 | 3/2013 | Ware | |
| 8,534,119 B2 | 9/2013 | Bean, Jr. et al. | |
| 2003/0050003 A1 | 3/2003 | Charron | |
| 2004/0065106 A1 | 4/2004 | Bash et al. | |
| 2005/0208888 A1 | 9/2005 | Moore et al. | |
| 2006/0248961 A1 | 11/2006 | Shachar et al. | |
| 2007/0163752 A1 | 7/2007 | Hyest | |
| 2007/0167125 A1 | 7/2007 | Rasmussen et al. | |
| 2007/0213000 A1 | 9/2007 | Day | |
| 2009/0277622 A1 | 11/2009 | Nair | |
| 2009/0326721 A1 | 12/2009 | Sugiyama et al. | |
| 2010/0061057 A1 | 3/2010 | Dersch et al. | |
| 2010/0186517 A1 | 7/2010 | Bean, Jr. | |
| 2010/0252233 A1 | 10/2010 | Absalom | |
| 2011/0014862 A1 | 1/2011 | Honold et al. | |

FOREIGN PATENT DOCUMENTS

| | | |
|---|---|---|
| DE | 102009011007 A1 | 9/2010 |
| EP | 0033182 A2 | 8/1981 |
| FR | 2 652 904 A1 | 4/1991 |
| JP | 60-188854 A | 9/1985 |
| JP | 62020585 A | 1/1987 |
| JP | H0328717 A | 2/1991 |
| JP | H0470516 A | 3/1992 |
| WO | 02/41777 A1 | 5/2002 |
| WO | 2010087917 A1 | 8/2010 |
| WO | 2010131594 A1 | 11/2010 |
| WO | 2010131954 A1 | 11/2010 |

OTHER PUBLICATIONS

Invitation to Pay Additional Fees and Partial International Search Report for PCT/US2009/053759 mailed Nov. 16, 2009.
International Search Report for PCT/US2011/063664 mailed Apr. 11, 2012.
International Search Report for PCT/US2011/034422 mailed Sep. 5, 2011.
International Search Report for PCT/US2009/068913 mailed Mar. 19, 2010.
American Power Conversion Corporation Brochure, "Hot Aisle Containment System (HACS)," 2008, pp. 1-68.

* cited by examiner

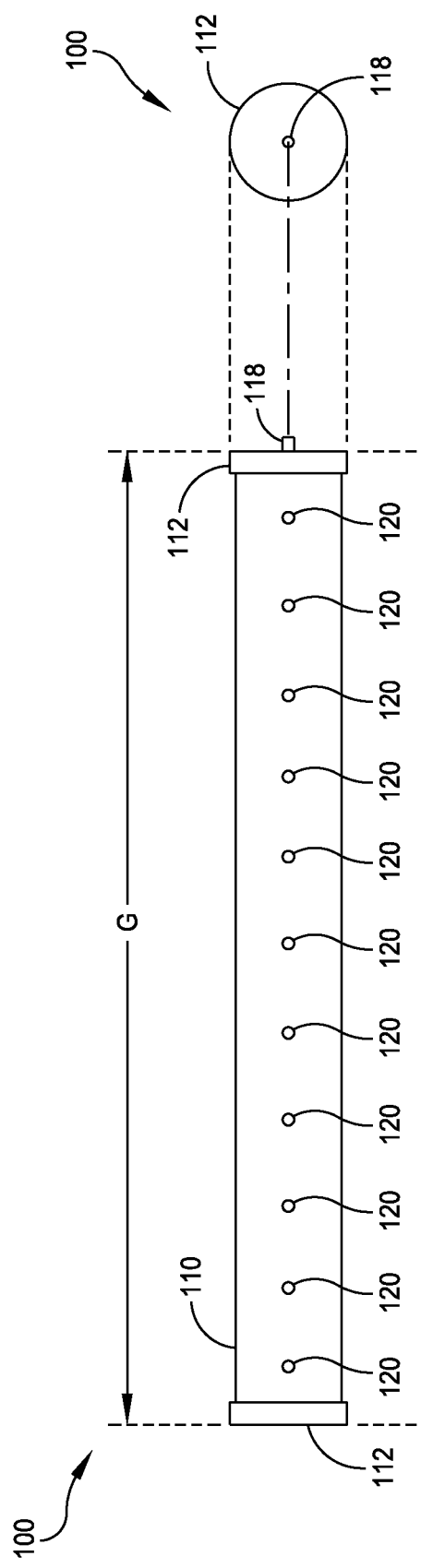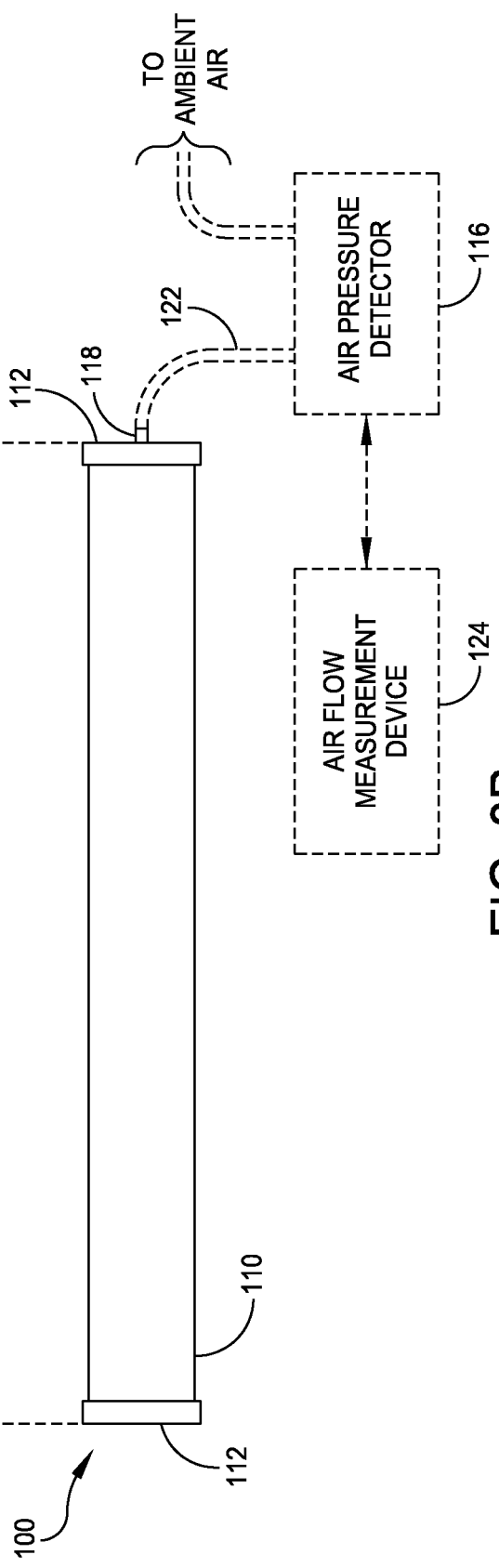

SYSTEM AND METHOD FOR AIR CONTAINMENT ZONE AIR LEAKAGE DETECTION

RELATED APPLICATIONS

This application is a Continuation of U.S. patent application Ser. No. 12/982,277, filed Dec. 30, 2010, which is incorporated herein by reference.

BACKGROUND OF THE INVENTION

1. Field of the Disclosure

The present disclosure relates to equipment rooms and data centers, and more particularly to methods and systems for measuring hot or cold aisle containment air leakage.

2. Discussion of Related Art

In many equipment room and data center environments, electronic equipment is installed in standardized equipment frames or enclosures called equipment racks, for example as defined by the Electronics Industries Association's EIA-310 specification. A data center may have many equipment racks, often located in close proximity to one another. The electronic equipment may include, for example, servers, network routers, data storage devices, telecommunications equipment, and the like, which generates heat that must be dissipated or otherwise treated to avoid adverse effects on the performance, reliability, and useful life of the equipment. In particular, rack-mounted equipment, housed within the confined space of an enclosure, may be vulnerable to an accumulation of heat within the enclosure. The amount of heat generated by a rack of equipment is related to the amount of electrical power consumed by the equipment, the power efficiency of the equipment, and other factors. Furthermore, over the course of time, various pieces of electronic equipment may be added, removed, replaced, or rearranged to accommodate evolving operational needs, which causes variations in the total amount of heat produced within the data center and within each enclosure.

To protect internal components from overheating, a piece of rack-mounted equipment may include one or more fans for drawing cool air across the components, and expelling heated air into the surrounding environment. Other equipment may manage heat dissipation through thermal convection, or radiational cooling, without the use of any airflow devices. Some equipment racks may include fans to provide supplemental cool air to the equipment mounted therein, or to draw hot air out of the enclosure. Additionally, many data centers provide chilled and conditioned air to augment the cooling requirements of the room.

Each of these cooling techniques consumes additional energy. Because the cooling demands of a data center can vary considerably, it is difficult, using known techniques, to achieve energy efficiency. For example, providing an amount of chilled air in excess of operational requirements wastes energy, whereas costly equipment damage may result from an insufficient supply of cool air.

BRIEF SUMMARY OF THE INVENTION

An aspect of the disclosure is directed to measurement of hot or cold aisle containment air leakage in a data center.

According to one embodiment, a system for measuring hot or cold aisle containment air leakage in a data center includes a plurality of equipment enclosures arranged in a first row and a second row, a plurality of panels cooperatively arranged with the plurality of equipment enclosures to form an air containment region, and a conduit mounted within the air containment region and sealed at each end, the conduit having an orifice and a plurality of openings distributed at substantially uniform intervals along a length of the conduit.

In another embodiment, the system may further include a differential air pressure detection device coupled to the orifice and configured to detect a difference between an air pressure within the conduit and ambient air pressure outside of the air containment region. The differential air pressure detection device may include a manometer.

In yet another embodiment, the system may further include an air flow measurement device configured to calculate an infiltration air flow rate of the air containment region based on the difference between the air pressure within the conduit and the ambient air pressure. The infiltration air flow rate of the air containment region may be calculated as in the equation:

$$\text{scfm} = (61474.2 * R_{HACS} - 36082.5) * DP + \text{offset}$$

wherein scfm is the air containment system infiltration rate, $R_{HACS}$ is the opening area ratio for the air containment system, DP is the absolute value of the ambient air pressure in inches of water column less the air containment system internal air pressure in inches of water column, and offset is a constant value. In one embodiment, the offset is 750.

In another embodiment, the conduit may be mounted substantially horizontally within the air containment region. In one embodiment, the openings are substantially upwardly facing. In another embodiment, the conduit may be mounted at a vertical height of approximately two-thirds of an interior height of the air containment region. In another embodiment, the length of the conduit may be substantially the same as an interior length of the air containment region. In yet another embodiment, a diameter of the conduit may be approximately one and one-half inches. In another embodiment, a diameter of each of the openings may be approximately one-quarter of one inch. In another embodiment, a distance between one of the openings and another of the openings may be approximately six inches.

According to one embodiment, a method of measuring hot or cold aisle containment air leakage in a data center includes providing a conduit that is mounted within an air containment region defined by an assembly having a plurality of panels cooperatively arranged with a plurality of equipment enclosures. The conduit is sealed at each end and has an orifice and a plurality of substantially upwardly facing openings distributed at substantially uniform intervals along a length of the conduit.

In another embodiment, the conduit may be mounted substantially horizontally at a vertical height of approximately two-thirds of an interior height of the air containment region. The length of the conduit may be substantially the same as an interior length of the air containment region.

In another embodiment, the method may further include detecting an air pressure within the conduit. Detecting the air pressure within the conduit may include coupling an air pressure detection device to the orifice and using the air pressure detection device to detect the air pressure within the conduit. In yet another embodiment, the method may further include detecting an ambient air pressure outside of the air containment region. In another embodiment, the method may further include determining an air pressure differential based on a difference between the air pressure detected within the conduit and the detected ambient air pressure. In another embodiment, the method may further include calculating an infiltration air flow rate of the air containment region based on the determined air pressure differential.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which:

FIG. 3A is a schematic diagram showing a lengthwise view of a structure of a portion of the air leakage measurement system of FIG. 2A;

FIG. 3B is a schematic diagram of another lengthwise view of the structure of FIG. 3A;

FIG. 3C is a schematic diagram of an endwise view of the structure of FIG. 3A;

DETAILED DESCRIPTION OF THE INVENTION

Figure 1:
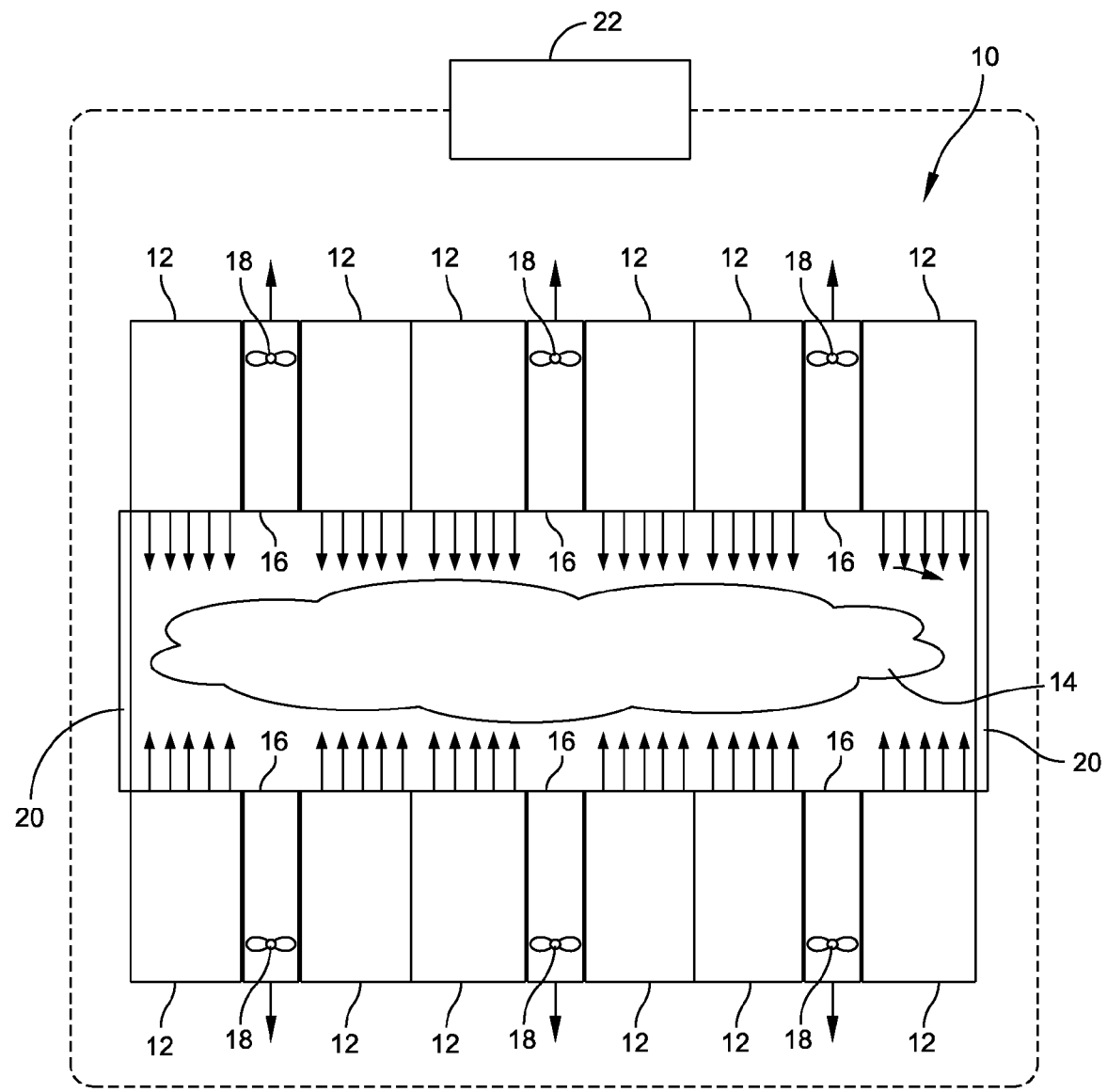
FIG. 1 is a schematic top view of a portion of a data center employing a hot or cold aisle containment air leakage measurement system in accordance with one embodiment of the present disclosure.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof, as well as additional items.

A typical data center may house many equipment cabinets or racks, for example, equipment racks sold by American Power Conversion Corporation (APC) of West Kingston, R.I., under the brand name NetShelter™. Each equipment rack may be configured to include a frame or housing adapted to support electronic equipment, such as computing, networking, and telecommunications equipment. The equipment racks are modular in construction and configurable in rows, which may be arranged such that cool air is drawn through the front of each rack, and air heated by the equipment within the racks is discharged through the back of each rack. To facilitate adequate air flow through the rack, the rack may have no front or rear doors or panels, or the doors or panels may be perforated or vented to provide an open area through which air can flow. The rows may be further arranged such that the back of each rack in one row faces the back of each rack in another row, or a facility wall, with some space in between the rows or walls to allow for air circulation. Such a space is sometimes referred to as a "hot aisle" because it loosely contains the warm or hot air exhausted by the rows of equipment racks. The space in front of each row of racks is sometimes referred to as a "cold aisle" because it provides a source of cooled, or ambient, air that is drawn into each rack. The data center may include a cooling system designed to manage the operating temperature, humidity, or both, of the equipment and the data center environment using, for example, sensible or latent cooling techniques.

When equipment racks are arranged within an open space, air from the hot aisle can mix with air in the cold aisle, thus increasing the temperature of the air provided in the cold aisle. This may result in the data center cooling system having to produce additional chilled air to compensate for the increased temperatures in the cold aisle, and thus decreasing the efficiency of the data center cooling system. Therefore, it is desirable to stringently contain the air in the hot aisle so as to prevent such mixing from occurring, and also to avoid feeding the cooling system with excessively warm or hot air. It is known to enclose the hot aisle with a containment system for isolating the hot aisle from the cold aisle and the ambient air of the data center. One containment system includes ceiling and wall assemblies that are designed to mount to one or more rows of equipment racks for containing the air in the hot aisle. Accordingly, warm or hot air exhausting from the equipment racks will be trapped in the hot aisle and prohibited from mixing with the ambient air. Alternatively, the containment system may be used to contain cool air provided by a cooling system. The trapped air may be managed separately from the ambient air, for example by withdrawing air from the hot aisle through an exhaust conduit, duct, or other air circulation device. Alternatively, the trapped air may be recirculated through the data center cooling system in controlled volumes and at controlled rates.

According to one embodiment of the present disclosure, when a hot or cold aisle is established using an air containment system, such as described below with reference to FIG. 1, it may be desirable to monitor the amount of air, rate of air, or both flowing between the hot or cold aisle and the ambient air space. By monitoring the air flow, the data center cooling system can be managed to optimize its energy efficiency. In particular, because air circulating through the equipment racks is forced into the confined space of the hot aisle, the air pressure within the hot aisle will be higher than the air pressure outside of the hot aisle. A certain amount of air may be drawn out of the hot aisle to reduce the air pressure within to enable cool air to flow into the equipment racks. The differential air pressure between the ambient air and the hot aisle may be used to calculate the volume, rate, or both, of air flowing from one space to another. For example, an ideal air flow, with respect to energy efficiency, cooling requirements, or other variables, may be determined based on certain factors, such as the desired temperature of air in the cool aisle or of the ambient air, the measured temperature of the air in the hot aisle, and other factors. Thus, it is appreciated that the air flow, and thus the data center cooling system, may be managed using the measured air pressure differential of the ambient air and the hot aisle. One technique for detecting an air pressure differential is described in U.S. Patent Publication No. 2010/0186517, entitled METHOD AND SYSTEM FOR DETECTING AIR PRESSURE NEUTRALITY IN AIR CONTAINMENT ZONES, filed on Jan. 28, 2009, which is owned by the assignee of the present disclosure and is fully incorporated herein by reference.

FIG. 1 is a schematic top view of a portion of a data center employing a hot or cold aisle containment air leakage measurement system in accordance with one embodiment of the present disclosure. Generally indicated at 10 is a portion of a data center, which includes a plurality of equipment racks, each indicated at 12. Each equipment rack 12 may house electronic equipment, such as computers, servers, telecommunications switches, network routers, and the like. The equipment racks 12 are arranged in rows such that one side (e.g., the backside) of each row of racks faces the same side (e.g., the backside) of the opposing row of racks. The air space between each pair of rows may define a hot aisle 14, so called because of the warm or hot air, generated by the equipment, which is expelled from the backside of each rack into the air space. It will be appreciated that, if the supply and return air flows are reversed, the hot aisle 14 effectively becomes a cold aisle, and accordingly the terms "hot aisle" and "cold aisle" are used interchangeably herein. The hot aisle 14 may further be enclosed by an air containment system (also referred to herein as a hot aisle containment system or HACS) so as to isolate the air therein from the rest of the data center 10 (e.g., the ambient air), and to separate supply (e.g., cold) and return (e.g., hot) air flows. In one arrangement, relatively cool air enters (infiltrates) the front side of each rack, is drawn through the rack to cool the equipment positioned in the rack, and discharged as warm or hot air into the hot aisle 14.

One or more cooling units, each indicated at 16, may be disposed in between the equipment racks 12 to provide chilled air for cooling the equipment, for reducing the amount of heat within the hot aisle 14, or both. For example, the cooling units 16 may be configured to draw warm air from the hot aisle 14 through the backs of the cooling units, cool the warm air, and exhaust the cooled air through the fronts of the cooling units into the data center 10. Air flow through the cooling units 16 may be supplemented by one or more fans 18.

According to one embodiment, an HACS is formed by enclosing the hot aisle 14 with a physical boundary, including, for example, a ceiling, walls, or both. Such an enclosure includes a plurality of panels each indicated at 20 in FIG. 1. Each equipment rack 12 draws relatively cool air from the ambient air surrounding the front of the equipment racks and other portions of the HACS. The desired airflow rate of any given equipment rack 12 is dependent upon the equipment, the ambient air temperature, the heat output by the equipment, and other factors, and may vary substantially over time. The combined net airflow through all equipment racks 12 and into the hot aisle 14 is highly variable and difficult to predict. Therefore, it is desirable to manage the rate and direction of air flow by extracting a certain amount of air from the hot aisle 14, creating a slight negative air pressure therein, to minimize the amount of hot air escaping from the hot aisle into the ambient air through backpressure. This further produces an air pressure differential that will naturally force ambient air through the racks. Energy economy can be achieved by operating the cooling units 16 to remove and cool air from the hot aisle 14 at a rate slightly greater than the rate of hot air entering the hot aisle from the equipment racks 12, as illustrated by the arrows in FIG. 1.

As will be discussed in further detail below, an air pressure sensing device is provided to detect air pressure within the hot aisle 14, the ambient air pressure, or both. The air pressure sensing device permits calculation of the volume, rate, or both of the air flowing between the hot aisle 14 and the ambient air space outside of the HACS. The results of the calculation may be used by a controller configured to control the operation of the cooling units 16, the fans 18, or both, using a control algorithm to maintain a desired air flow between the hot aisle 14 and the ambient air, or for other air management purposes, such as temperature or humidity control.

A controller 22 may be provided to control the operation of the equipment racks 12, the cooling units 16, or both. The controller 22 is illustrated schematically as being able to control all of the components of the data center 10, including a component for managing air flow and equipment cooling.

Figure 2A:
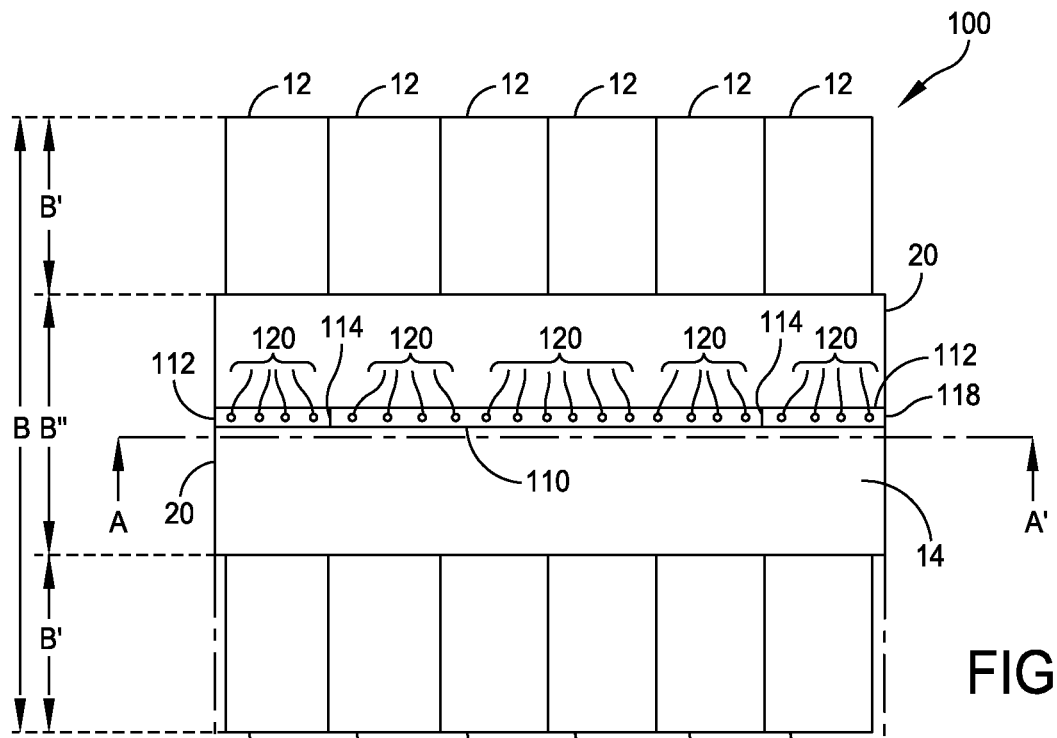
FIG. 2A is a schematic top view of a hot or cold aisle containment air leakage measurement system in accordance with another embodiment of the present disclosure.
Figure 2B:
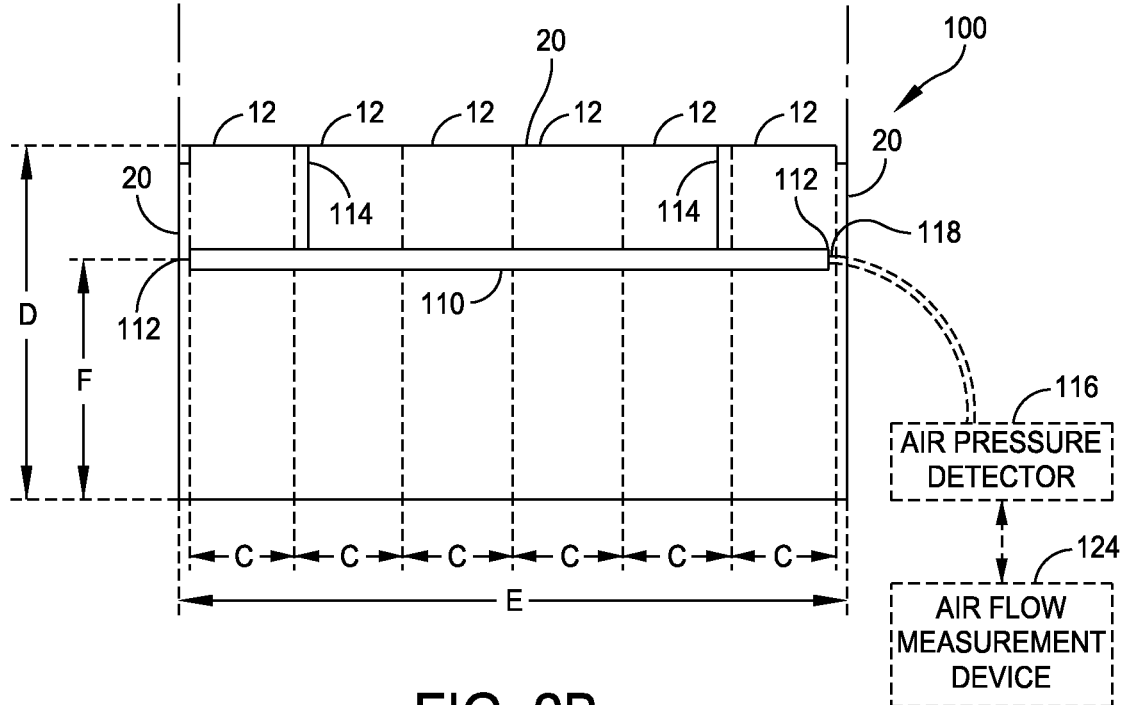
FIG. 2B is a schematic cross-sectional side view taken along a cut line A-A' of FIG. 2A.

FIGS. 2A and 2B illustrate a hot or cold aisle containment air leakage measurement system 100 according to one embodiment of the present disclosure. In FIG. 2A, a schematic top view of the air leakage measurement system 100 is shown. In FIG. 2B, a schematic cross-sectional side view along a cut line A-A' of FIG. 2A is shown. In the top view, the internal configuration is shown for descriptive purposes, although the internal configuration of the system 100 cannot actually be seen because it is normally covered by a panel, ceiling, or other enclosure.

The system 100 includes a plurality of equipment racks, each indicated at 12, and a plurality of panels 20, which are cooperatively arranged to form an HACS enclosing the hot aisle 14. The system 100 further includes a conduit 110, which forms one portion of an air pressure sensing device for detecting an air pressure within the hot aisle 14. The conduit 110 defines an air passage therein (such as air passage 111 shown in FIG. 4 below), which is sealed at each end by end caps 112 and mounted within the hot aisle 14. The conduit 110 includes a plurality of openings 120 for communicating air between the hot aisle 14 and the air passage within the conduit, and further includes an orifice 118 disposed in one end cap 112 or, alternatively, in another portion of the conduit. The orifice 118 provides a port for coupling the conduit 110 to an optional air pressure detector 116, such as a precision inclined manometer. The air pressure detector 116 may be configured to detect an air pressure in the air passage of the conduit 110, an air pressure of the ambient air outside of the air containment region 14, or both. The conduit 110 is mounted within the hot aisle 14 by, for example, suspending the conduit from the ceiling or end panels 20 using one or more hangers 114. In one embodiment, the hangers 114 are fabricated with nylon, metal, plastic, or another material that is suitable for supporting the conduit 110 in a substantially fixed location and orientation within the hot aisle 14. It will be appreciated that other mounting techniques may be employed (e.g., supporting the conduit from below on stands, legs, struts, or other support structures).

According to one embodiment of the present disclosure, the HACS includes two or more equipment racks 12, such as 600 mm NetShelter SX enclosures manufactured by APC. As shown in FIG. 2A, the equipment racks 12 are arranged in two rows (or, in the case of two racks, the racks are arranged facing or opposing each other) with a space in between each row. The equipment racks 12 may have perforated front and rear doors to provide ventilation for the equipment mounted in each rack. The HACS further includes the plurality of panels 20, including a front panel, a back panel, and a top panel, which are arranged cooperatively with the equipment racks 12 to form an N×2 HACS, wherein N represents the total number of rack pairs in the HACS.

Figure 2C:
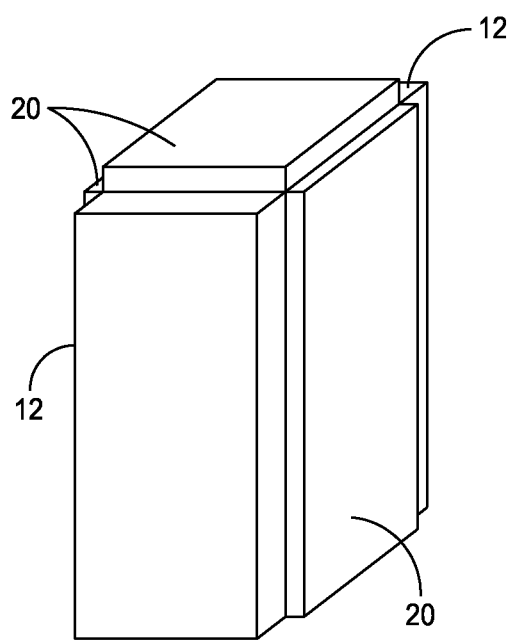
FIG. 2C is a schematic perspective view of a portion of the system of FIG. 2A.
Figure 2D:
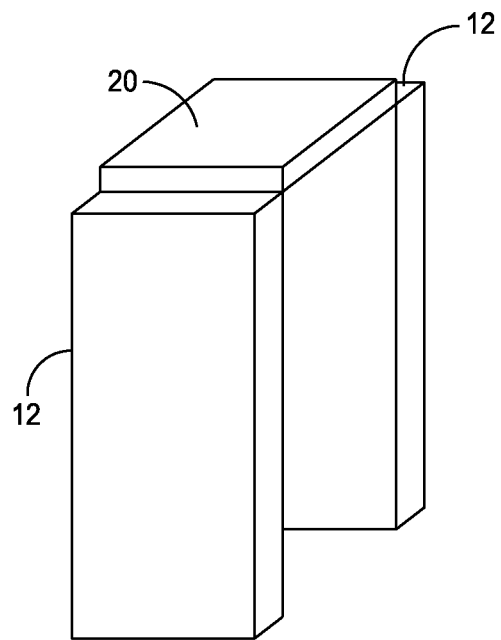
FIG. 2D is a schematic perspective view of another portion of the system of FIG. 2A.

FIG. 2C is a schematic perspective view of the HACS of FIG. 2A configured as a 1×2 HACS, which includes two equipment racks 12 and a plurality of panels 20. The racks 12 and panels 20 are cooperatively arranged to form the 1×2 HACS enclosing the hot aisle 14 (not shown). FIG. 2D is a schematic perspective view of one additional pair of racks 12 and a top panel 20, which may be arranged cooperatively with the components of the 1×2 HACS of FIG. 2C to form, for example, a 2×2 HACS. Any number of additional pairs of racks 12 and panels 20 may be combined with the 1×2 HACS to form the N×2 HACS.

In a 1×2 HACS, the total area of the air containment system that is open to the ambient air includes five sides: front, back, and top panels 20, and the left and right sides, which are formed by each of the two racks 20 in the 1×2 HACS. Air infiltration is generated through one or more of these sides. Additional rack pairs may be included in the HACS by placing the racks 20 side-by-side in each row and providing additional (or larger) top panels over the hot aisle 14. For each additional rack pair, three additional sides are exposed to the ambient air: the top panel 20, and the left and right sides of each rack, respectively.

According to one embodiment of the disclosure, it is appreciated that while the HACS is designed to substantially contain air within the hot aisle 14, any surface of the HACS, in particular exterior surfaces, may be configured to provide ventilation of air into and out of the interior portions of the contained area (including the hot aisle 14). For example, as described above, the equipment racks 12, which form a portion of the HACS, may have no front or rear doors or panels, or the doors or panels may be perforated or vented to provide an open area through which air can flow. Further, the panels 20 of the HACS may be vented or perforated to provide an air flow path between the hot aisle 14 and the ambient air. For the purposes of the following description, a total opening area of the HACS is defined as the entire exterior surface area of the HACS, including the exterior surfaces of the panels 20 and each equipment rack 12 in a cooperative arrangement that forms the HACS. It will be understood that, typically, a percentage of the total opening area (e.g., 50% or less) may provide such ventilation.

Referring again to FIGS. 2A and 2B, in one embodiment, the HACS has the following dimensions: the depth of the HACS, indicated at B, is 120 inches (the depth of each rack B' is 42 inches and the depth of the hot aisle B" is 36 inches); the width of each rack 12, indicated at C, is 24 inches; and the height of the HACS, indicated at D, is 80.3 inches. Thus, the total opening area of a 1×2 HACS is 26006.4 square inches [(120*80.3*2)+(24*80.3*2)+(24*120) for front/back, left/right, and top, respectively]. For each additional rack pair (i.e., where there are more than two racks), the additional total opening area is 6734.4 square inches [(24*80.3*2+24*120) for left/right and top, respectively]. Accordingly, the total opening area for an N×2 HACS is the total opening area of a 1×2 HACS (e.g., 26006.4 sq. inches) plus (N-1) times the additional opening area of each additional rack pair (e.g., (N-1)*6734.4 sq. inches). It will be appreciated that the dimensions described herein are intended as non-limiting examples, and that the HACS may have different dimensions depending upon its application.

According to one embodiment, an HACS opening area ratio is defined according to the following equation:

$$R_{HACS} = (N \times 2 \text{ HACS total opening area})/(1 \times 2 \text{ HACS total opening area})$$

where $R_{HACS}$ represents the N×2 HACS opening area as a factor of the 1×2 HACS total opening area. The table below shows approximated values for $R_{HACS}$ with respect to certain values of N using the exemplary HACS dimensions described above:

| N | 1 | 2 | 3 | 4 |
|---|---|---|---|---|
| HACS total opening area (sq. inches) | 26006 | 32741 | 39475 | 46210 |
| HACS opening area ratio ($R_{HACS}$) | 1.000 | 1.259 | 1.518 | 1.777 |

The HACS opening area ratio can be used, in conjunction with an HACS internal air pressure measurement, as part of a calculation of a rate of air flow (also referred to herein as an air infiltration rate) between the hot aisle 14 and the ambient air outside of the HACS, such as described below.

According to one embodiment, the air infiltration rate of the HACS is calculated according to the following equation:

$$\text{scfm} = (61474.2 * R_{HACS} - 36082.5) * DP$$

where scfm is the HACS air infiltration rate in standard cubic feet per minute, $R_{HACS}$ is the HACS opening area ratio, and DP is the absolute value of the difference between the ambient air pressure outside of the HACS and the internal average air pressure of the hot aisle 14 (e.g., as measured in inches of water column or other units of air pressure). Theoretically, DP is zero when no HACS air infiltration occurs (e.g., when there is no air leakage between the hot aisle 14 and the ambient air). Negative scfm indicates a negative air flow rate (i.e., exfiltration of air from the HACS).

To account for measurement accuracy limitations of air pressure measurement equipment at relatively low infiltration rates (e.g., less than approximately 750 scfm), according to another embodiment, an offset may optionally be applied to the above described HACS air infiltration rate equation as follows:

$$\text{scfm} = (61474.2 * R_{HACS} - 36082.5) * DP + 750$$

This offset, which in this example is 750, may be adjusted according to known or experimentally derived tolerances and/or accuracy limitations of the air pressure measurement equipment that is used in a particular application. For example, if the accuracy of the equipment can be established for infiltration rates as low as approximately 500 scfm, the offset of 750 in the above equation may be substituted with an offset of 500.

As discussed above, the conduit 110 forms a portion of the air pressure sensing device for measuring the air pressure within the hot aisle 14. According to one embodiment, the conduit 110 is mounted substantially horizontally within the hot aisle 14 at a height F, as shown in FIG. 2B, which is approximately two-thirds of the interior height of the HACS, as measured from the floor upward. Although the conduit 110 may be mounted in any configuration, some configurations may provide particular advantages as compared to others. Due to the complexity of air flows within the hot aisle 14, different mounting configurations may produce different air pressure measurements.

FIGS. 3A, 3B and 3C are schematic diagrams showing a structure of a portion of the air leakage measurement system 100 of FIG. 2A, and in particular, a more detailed view of the conduit 110. In FIG. 3A, a lengthwise top view of the conduit 110 is shown. In FIG. 3B, a lengthwise side view of the conduit 110 is shown, and in FIG. 3C, an end view of the conduit is shown. It will be appreciated that references to the top, side, and end of the conduit 110 in FIGS. 3A, 3B and 3C are for descriptive purposes only, and that all positional orientations of the conduit with respect to the air leakage management system 100 inferred by such descriptions herein are intended as non-limiting examples of some embodiments of the disclosure. As described above, the conduit 110 has end caps 112 at each end, the orifice 118 that is disposed through at least one of the end caps 112 or through another portion of the conduit, and the plurality of openings 120 along a length G of the conduit. The system 100 may further include the air pressure detector 116 and the air flow measurement device 124 coupled to the detector 116. The air flow measurement device 124 may be integrated into the air pressure detector 116, or may be implemented as a separate device.

According to one embodiment, the orifice 118 is configured to be coupled to the air pressure detector 116, which may be, for example, a precision inclined manometer. The air pressure detector 116 includes at least one port to which a tube 122 is coupled at one end. The other end of the tube 122 is coupled to the orifice 118, which enables the air pressure within the conduit 110 to be communicated to the air pressure detector 116, and allows the detector to be located at a location that is remote from the conduit 110 (e.g., outside of the HACS). In some embodiments, the air pressure detector 116 includes a second port that is either open to ambient air or coupled to another tube that communicates ambient air pressure or atmospheric pressure to the air pressure detector. The air pressure detector 116 may be configured to detect one or more air pressures from distinct sources, for example, a first air pressure of air in the hot aisle 14 and a second air pressure of the ambient air. For instance, the air pressure detector 116 may be a precision inclined manometer, which indicates the presence and magnitude of an air pressure differential between two regions of air pressure, as will be understood by one of skill in the art. One such manometer is the Dwyer® Durablock® Series 250-AF Inclined Manometer Air Filter Gage, sold by Dwyer Instruments, Inc. of Michigan City, Ind. The air pressure detector 116 may be further configured to determine an air pressure differential between two or more of the distinct sources, such as a difference between the first air pressure and the second air pressure. One such air pressure detector is the DigiMag® Digital Differential Pressure and Flow Gage, also sold by Dwyer Instruments, Inc.

In one embodiment, the air flow measurement device 124 is configured to calculate an air flow rate based on the air pressure differential determined by the air pressure detector 116 using one or more of the equations described above. The calculation may be performed by the air pressure detector 116 itself, or by a separate calculation device, such as a computer or other processor that receives data (e.g., including data representing the air pressure differential) from the air pressure detector. One exemplary air flow measurement device will be described below in further detail with respect to FIG. 5.

Although the length G of the conduit 110 may be any length, some lengths may provide particular advantages as compared to others. In one embodiment, length G is substantially the same as an interior length of the hot aisle 14. For example, length G may be substantially the same as exterior length E, as shown in FIG. 2B, reduced accordingly to account for a thickness of each of the end panels 20, which may be a negligible amount. The air pressure within the hot aisle 14 may vary across the length of the hot aisle. Thus, by extending the conduit 110 along the entire interior length of the hot aisle 14, the air pressure in the air passage 111 (shown in FIG. 4) of the conduit will effectively be an average air pressure across the length of the hot aisle, as will be appreciated by one of skill in the art. Further, if the length of the conduit 110 is less than the entire interior length of the hot aisle 14, the air passage 111 will contain an average air pressure corresponding with only a portion of the hot aisle. Accordingly, it is appreciated that the length and placement of the conduit 110, among other factors (e.g., the number and placement of the openings 120) will affect the performance of the air leakage management system 100.

As shown in FIG. 3A, according to one embodiment, each of the plurality of openings 120 in the conduit 110 are upwardly facing. Although the openings 120 may be arranged in any configuration relative to each other and to the positional orientation of the conduit 110, some configurations may provide particular advantages as compared to others. For example, upwardly facing openings 120 enable the air passage 111 within the conduit 110 to receive a combination of static and dynamic air pressure that enables the air pressure detection device 116 to properly detect the average air pressure throughout the hot aisle 14 or a portion thereof.

Figure 4:
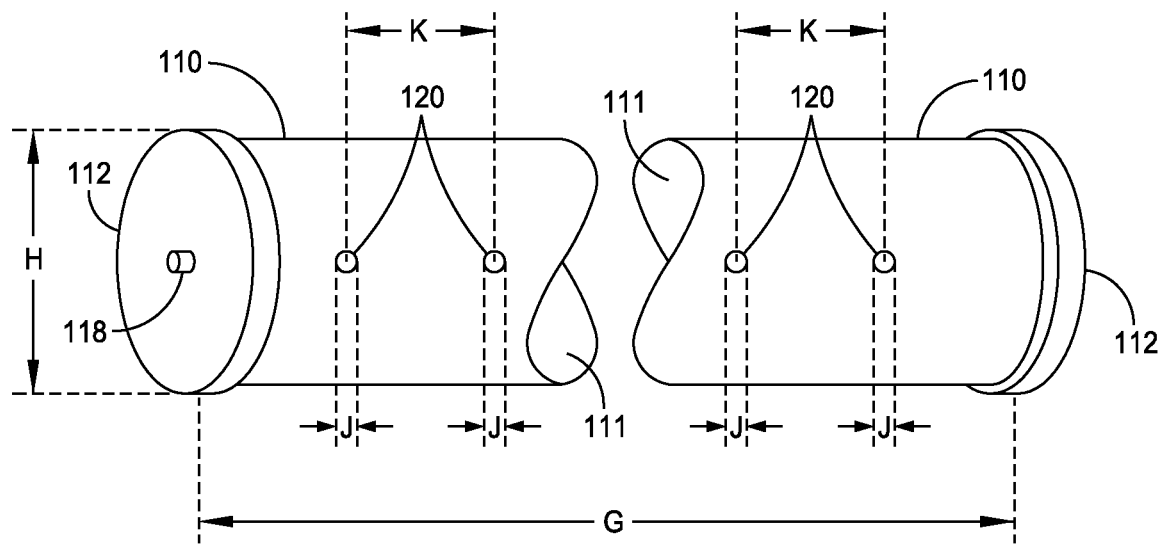
FIG. 4 shows a perspective view of a portion of the air leakage measurement system of FIGS. 2 and 3.

FIG. 4 shows a perspective view of the conduit 110 of FIGS. 2 and 3. For the purposes of clarity, the conduit 110 in FIG. 4 is shown without reference to any particular positional orientation. As described above, the conduit 110 defines the air passage 111 therein, and includes the plurality of openings 120 for communicating air pressure between the air passage and air outside of the conduit. Further, each end of the conduit 110 is sealed with the end cap 112 such that, generally, air may only flow between the air passage 111 and the outside of the conduit through the openings 120. According to one embodiment, the conduit 110, the end caps 112, or both are fabricated with polyvinyl chloride (PVC) or another suitable material, such as acrylonitrile butadiene styrene (ABS), unplasticized polyvinyl chloride (uPVC), chlorinated polyvinyl chloride (cPVC), polypropylene (PP), polyethylene (PE), polyvinylidene fluoride (PVDF), or polybutylene (PB).

In some embodiments, the conduit 112 is substantially cylindrical and has a length G and diameter H. As discussed above, the length G may be any length, but is preferably substantially the same as the interior length of the hot aisle 14. In one embodiment, the diameter H is approximately one and one-half inches, although it will be appreciated that other diameters are possible.

According to one embodiment, each of the plurality of openings 120 has a diameter J that is approximately one-quarter of one inch. Each of the openings 120 may be deburred during fabrication to facilitate the communication of air flowing therethrough. In some embodiments, the openings 120 are distributed at substantially uniform intervals K along the length G of the conduit 110. The interval K, according to one embodiment, is approximately six inches, although it will be appreciated that other intervals, which may or may not be uniform, may be alternatively employed.

Figure 5:
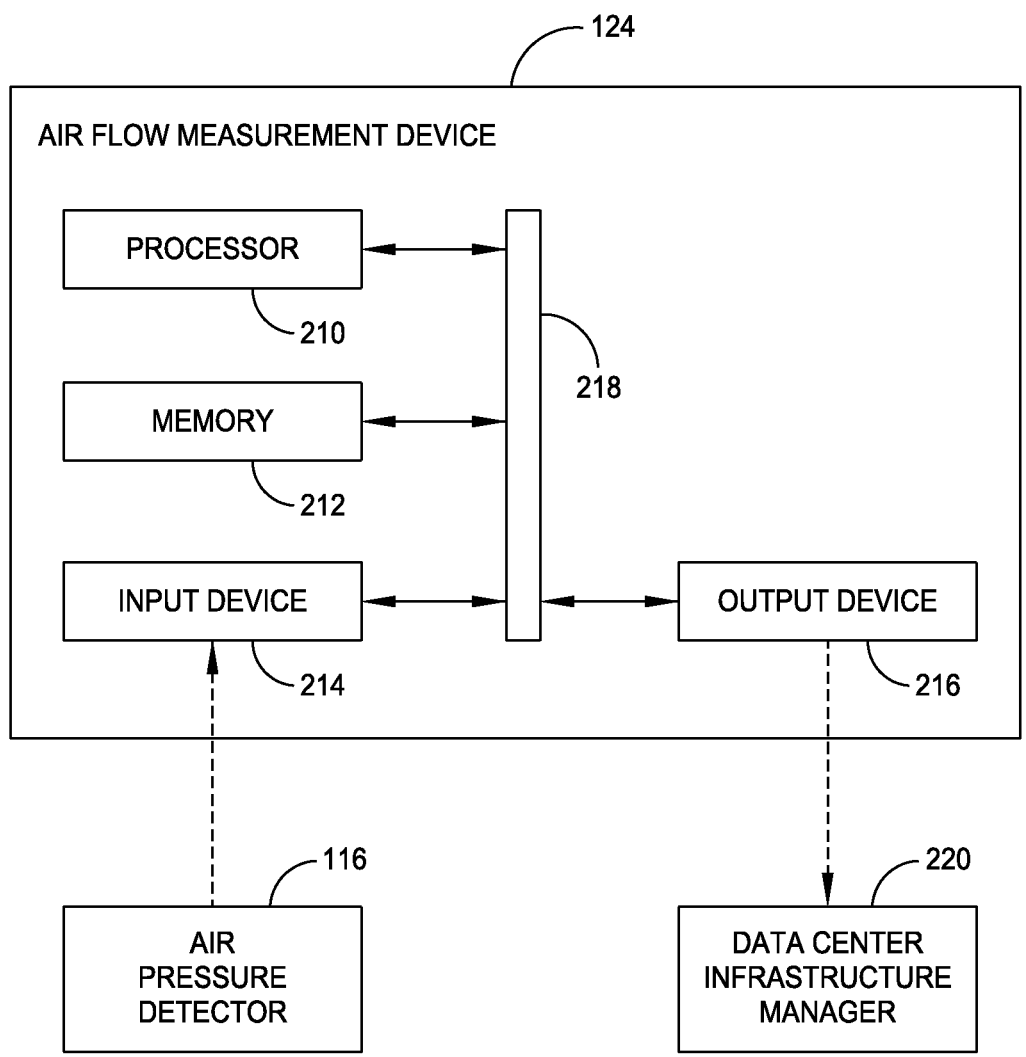
FIG. 5 shows a schematic diagram of one embodiment of another portion of the air leakage measurement system of FIGS. 2 and 3.

FIG. 5 shows a schematic diagram of one embodiment of the air flow measurement device 124 of FIGS. 2 and 3. The air flow measurement device 124 includes a processor 210, a memory 212, an input device 214, an output device 216, and a data bus 218. The processor 210, memory 212, input device 214, and output device 216 are each connected to the data bus 218 so that each may exchange data with one another. The input device 214 may be coupled to the air pressure detector 116, such as described above with respect to FIG. 3, to receive input data including a differential air pressure value. The output device 216 may be coupled to a data center infrastructure manager 220, such as InfraStruXure® Central Server, Part Number AP9475, sold by American Power Conversion Corporation of West Kingston, R.I., or other data center infrastructure management system. The memory includes a program having instructions that when executed by the processor 210 perform calculations according to one or more of the equations described herein.

According to one embodiment, the air flow measurement device 124 is implemented in one or more computer systems. The computer system(s) may be, for example, general-purpose computers such as those based on Intel PENTIUM-type processor, Motorola PowerPC, Sun UltraSPARC, Hewlett-Packard PA-RISC processors, or any other type of processor. Alternatively, the air flow measurement device 124 may be implemented in a special-purpose device, such as a manometer having a processor configured to execute instructions including instructions configured to perform calculations using one or more of the equations described herein.

Figure 6:
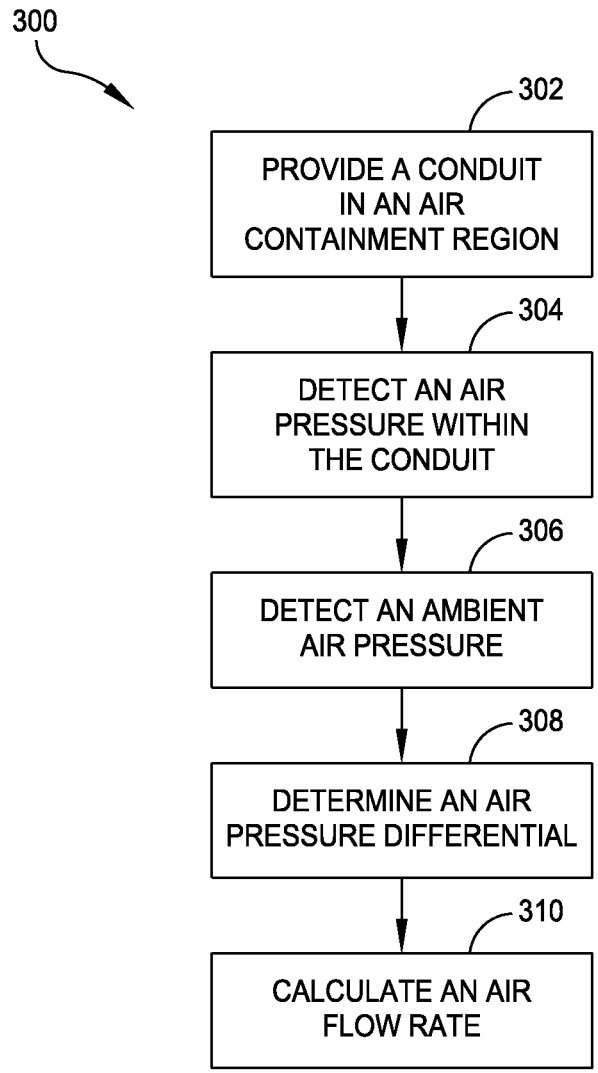
FIG. 6 illustrates a flow diagram for a method of hot or cold aisle containment air leakage measurement in accordance with yet another embodiment of the present disclosure.

FIG. 6 illustrates a flow diagram for a method of hot or cold aisle containment air leakage measurement 300 according to one embodiment of the present disclosure. At block 302, a conduit, such the conduit 110 described above with reference to FIGS. 2-4, is provided within a hot or cold aisle that is enclosed by an air containment system, such as the HACS described above, also with reference to FIGS. 2-4. The conduit defines an air passage therein and includes a plurality of openings that allow air pressure to communicate between the air passage and the hot or cold aisle outside of the conduit.

At block 304, an air pressure of the air passage within the conduit is detected. The air pressure may be detected, for example, using the air pressure detector 116, such as a manometer coupled to the orifice 118, which is disposed in the conduit 110. At block 306, an ambient air pressure outside of the air containment region is detected. The ambient air pressure may be detected, for example, using the same manometer as above. At block 308, an air pressure differential is determined based on the difference between the air pressure detected in the air passage of the conduit and the detected ambient air pressure. The air pressure differential may be a dimensionless value, or may be presented, for example, in units corresponding to inches of water column.

At block 310, an air flow rate is calculated based on the air pressure differential. In one embodiment, the air flow rate is calculated using the following equation:

$$\text{scfm} = (61474.2 * R_{HACS} - 36082.5) * DP + \text{offset}$$

where scfm is the air infiltration rate of the air containment region in standard cubic feet per minute, $R_{HACS}$ is the total opening area ratio of the air containment system, DP is the absolute value of the difference between the ambient air pressure outside of the air containment system and the air containment system internal average air pressure (e.g., as measured in inches of water column or other units of air pressure), and offset is an optional constant value that may be applied to account for accuracy limitations of the air pressure detector for relatively low air leakage rates. According to one embodiment, the value of offset is 750. Negative scfm indicates a negative air flow rate (i.e., exfiltration of air from the HACS).

Having thus described at least one embodiment of the present disclosure, various alternations, modifications and improvements will readily occur to those skilled in the art. Such alterations, modifications and improvements are intended to be within the scope and spirit of the disclosure. For example, the present invention may be implemented in an air containment system having different dimensions, different total opening areas, and different arrangements than those described herein. In another example, the orifice disposed through the conduit may be located at either end cap, or elsewhere on the conduit. In one embodiment, the conduit is substantially cylindrical, although it will be appreciated that the conduit may be formed in other shapes (e.g., rectangular or triangular, among others). Further, as described above, the present invention may be utilized in either hot or cold aisle applications, or in applications where the hot or cold aisle is enclosed by a facility wall or other structure. Accordingly, the foregoing description is by way of example only and is not intended to be limiting. The disclosure's limit is defined only in the following claims and equivalents thereto.

What is claimed is:

1. A system for measuring hot or cold aisle containment air leakage in a data center, the system comprising:
   a plurality of equipment enclosures arranged in a first row and a second row;
   a plurality of panels cooperatively arranged with the plurality of equipment enclosures to form an air containment region;
   a conduit mounted within the air containment region and sealed at each end, the conduit having an orifice and a plurality of openings distributed at substantially uniform intervals along a length of the conduit;
   a differential air pressure detection device coupled to the orifice and configured to detect a difference between an air pressure within the conduit and ambient air pressure outside of the air containment region; and
   an air flow measurement device configured to calculate an infiltration air flow rate of the air containment region based on the difference between the air pressure within the conduit and the ambient air pressure.

2. The system of claim 1, wherein the differential air pressure detection device includes a manometer.

3. The system of claim 1, wherein the conduit is mounted substantially horizontally within the air containment region.

4. The system of claim 1, wherein the plurality of openings are substantially upwardly facing.

5. The system of claim 1, wherein the conduit is mounted at a vertical height of approximately two-thirds of an interior height of the air containment region.

6. The system of claim 1, wherein the length of the conduit is substantially the same as an interior length of the air containment region.

7. The system of claim 1, wherein a diameter of the conduit is approximately one and one-half inches.

8. The system of claim 7, wherein a diameter of each of the plurality of openings is approximately one-quarter of one inch.

9. The system of claim 8, wherein a distance between one of the plurality of openings and another of the plurality of openings is approximately six inches.

10. A method of measuring hot or cold aisle containment air leakage in a data center, the method comprising:
    providing a conduit that is mounted within an air containment region defined by an assembly having a plurality of panels cooperatively arranged with a plurality of equipment enclosures, the conduit being sealed at each end and having an orifice and a plurality of substantially upwardly facing openings distributed at substantially uniform intervals along a length of the conduit;
    detecting an air pressure within the conduit;
    detecting an ambient air pressure outside of the air containment region;
    determining an air pressure differential based on a difference between the air pressure detected within the conduit and the detected ambient air pressure; and
    calculating an infiltration air flow rate of the air containment region based on the determined air pressure differential.

11. The method of claim 10, wherein the conduit is mounted substantially horizontally at a vertical height of approximately two-thirds of an interior height of the air containment region, and wherein the length of the conduit is substantially the same as an interior length of the air containment region.

12. The method of claim 10, wherein detecting the air pressure within the conduit includes coupling an air pressure detection device to the orifice and using the air pressure detection device to detect the air pressure within the conduit.

* * * * *